TRANSISTORIZED SUPPRESSED CARRIER BALANCED MODULATOR
Filed June 1, 1965
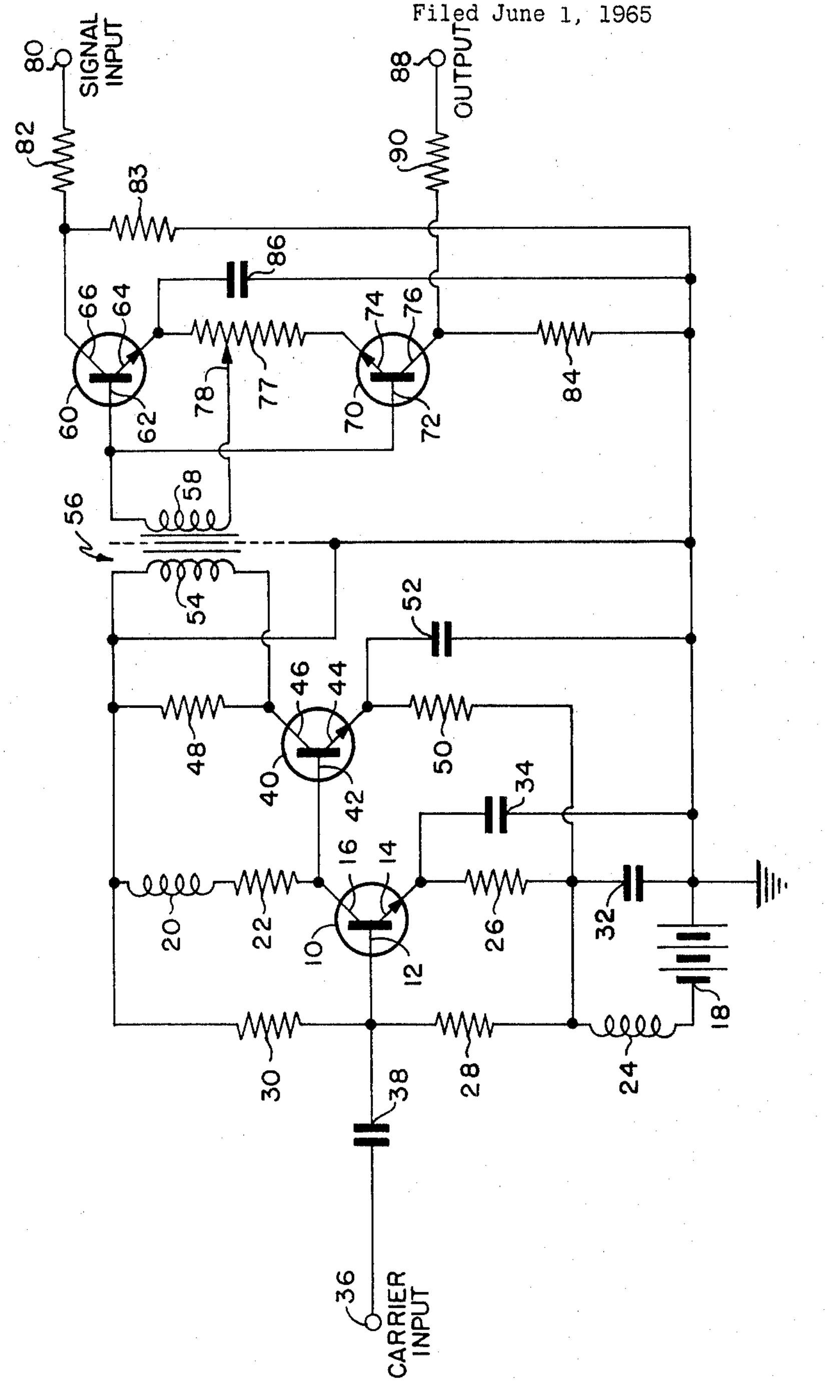
INVENTORS.
JOHN L. DENNIS
LAUGHTON T. FINE
BY Alden D. Redfield
Irwin P. Garfinkle
ATTORNEYS.

Patented June 18, 1968

3,389,327

TRANSISTORIZED SUPPRESSED CARRIER BALANCED MODULATOR

Laughton T. Fine, Cincinnati, Ohio, and John L. Dennis, Lexington, Ky., assignors to Avco Corporation, Cincinnati, Ohio, a corporation of Delaware
Filed June 1, 1965, Ser. No. 460,138
7 Claims. (Cl. 332—44)

ABSTRACT OF THE DISCLOSURE

A sine wave carrier is converted to a square wave form and then applied through a broad band pulse transformer to a balanced modulator. The balanced modulator comprises two transistors having their emitters interconnected and being supplied in series between the collector and emitter of each of the transistors. The carrier is applied in phase to the base of each transistor and the modulated output with carrier suppressed is derived from the collector of one of the transistors.

This invention relates to an improved signal modulation system, and more particularly to a balanced modulator system in which the intermodulation products at the output of the modulator are substantially reduced.

The invention finds particular utility in a single sideband communications system in which the radio frequency carrier is suppressed. In conventional single sideband systems the radio frequency carrier and modulating signal are applied to a balanced modulator. If the modulator is symmetrically arranged, the carrier is cancelled from the output, while two sidebands are developed. A single sideband is then obtained by passing the double sideband wave through a selective filter network where one sideband is rejected. In accordance with this invention, the carrier is processed to produce an essentially square wave at the carrier frequency and is then applied to a novel modulator. The prior processing of the carrier, in combination with the novel modulator, fulfills the primary object of this invention, i.e., to substantially reduce the intermodulation products in the modulator output.

Another object of this invention is to provide a novel transistorized balanced modulator.

Still another object of this invention is to provide a balanced modulation system in which the radio frequency carrier is suppressed from the modulator output, the carrier having been wave shaped to reduce its peak level and diminish its rise and fall times.

Another object of this invention is to provide electronic circuitry for multiplexing two or more signals such that the intelligence component may be processed unencumbered by the prime carrier.

Another object of the invention is to translate low frequency signals to a higher frequency with the carrier suppressed.

Other objects achieved by this invention include a modulation system providing: (1) the maintenance of relatively constant carrier rejection, (2) timed and limited amplitude switching, (3) a uniformly chopped signal which may be readily processed for eventual transmission, and (4) exact balance with active elements which may not be perfectly matched.

For further objects and advantages and for a more complete understanding of the precise nature of this invention, reference should now be made to the following detailed specification and to the accompanying drawing in which the single figure represents a typical embodiment of this invention.

The circuitry illustrated in the drawing was incorporated and reduced to practice in a single sideband communications system and provided the modulation stage of the transmitter. The system includes two stages of radio frequency amplification. The first stage comprises a transistor 10 having a base 12, an emitter 14, and a collector 16. The operating bias for the transistor 10 is supplied from any convenient B supply, illustrated as a battery 18. The grounded positive terminal of battery 18 is connected to the collector 16 through an inductor 20 and a collector load resistor 22, while the negative terminal is connected to the emitter 14 through a choke 24 and an emitter-resistor 26. Operating base bias is provided by means of voltage-dividing resistors 28 and 30 connected in series across the battery 18, the junction of resistors 28 and 30 being connected to the base 12. Capacitor 32 provides a filter for alternating current components at the B supply or battery 18.

The emitter 14 of transistor 10 is connected to ground for alternating currents by means of a capacitor 34. The radio frequency carrier signal is applied between the base 12 and ground from an input terminal 36 through a coupling capacitor 38. Radio frequency signals are derived from the collector 16 of transistor 10 and applied to a second stage of amplification.

The second stage comprises a transistor 40 having a base 42, an emitter 44, and a collector 46. Operating bias for the collector 46 is provided by a connection to the grounded terminal of battery 18 through a load resistor 48 in parallel with the primary winding 54 of a transformer 56, while operating bias for the emitter 44 is provided by a connection to the other terminal of the battery 18 through emitter-resistor 50 and the choke 24. Capacitor 52 provides an alternating current path to ground from the emitter 44. The amplified radio frequency output of the first stage is direct coupled from the collector 16 to the basic 42. The second stage radio frequency output is developed across the resistor 48 and primary winding 54.

While the transistor 10 provides relatively linear amplification for the radio frequency carrier signal, the collector and emitter load resistors 48 and 50 are selected so that the transistor 40 saturates when the amplified signal of the radio frequency amplified carrier signal exceeds a predetermined positive or negative level, thereby clipping the positive and negative peaks of the amplified carrier to produce an output having an essentially square wave form.

The square wave developed across the collector load resistor 48 is then applied through the primary winding 54. The transformer 56 is a broadband pulse transformer having a secondary winding 58 supplying the square wave form at the carrier frequency to the succeeding novel balanced modulator. The transformer 56 is provided with a conventional Faraday shield.

The balanced modulator includes a transistor 60 having a base 62, an emitter 64, and a collector 66, and a transistor 70 having a base 72, an emitter 74, and a collector 76. The emitters 64 and 74 are interconnected by means of a resistor 77 having a movable tap 78. The square wave output developed across the secondary winding 58 of transformer 56 is applied in phase between each of the bases 62 and 72 and the tap 78.

The input signal for modulating the carrier is applied from a terminal 80 through a resistor 82 across resistor 83 and through the collector-emitter junction of transistor 60, the resistor 77, the collector-emitter junction of transistor 70, and a load resistor 84. A capacitor 86 provides a carrier signal balance path to compensate for stray capacitance. The modulated output with the carrier suppressed is derived at the terminal 88 through resistor 90 from across the load resistor 84. Carrier suppression comes about by balancing the drive of the two switch transistors with respect to ground.

In operation, the square wave at the carrier frequency developed at the output of the transistor 40 is applied similtaneously through the transformer 56 to the bases of both transistors 60 and 70. This causes the transistors 60 and 70 to function as switches for the modulation signal applied at the terminal 80. The gating of the transistors 60 and 70 by the high frequency square wave chops the lower frequency modulation signals as they are passed through the transistors, and this results in an amplitude modulation of the carrier, the modulation representing the intelligence in the multiplexed wave generated across the load resistor 84.

The relative drive developed in each of the transistors 60 and 70 is governed by the position of the tap 78 in the back-to-back emitter circuit. Since the drive from the transformer 56 is effectively on the base-emitter of each of transistors 60 and 70, these two transistors are switched simultaneously towards saturation at the carrier frequency. Their multiplexed output is a function of the signal input if the carrier drive is sufficient to achieve collector saturation in the switch transistors 60 and 70.

The instantaneous collector voltage on transistor 60 is the amplitude of the modulation signal, while the collector voltage on transistor 70 is the generated back voltage developed in the output circuit. The higher frequency drive on the base-emitter junctions of both transistors is sufficient in amplitude to switch the collector-emitter resistors cyclically from a very high value to a near short-circuit condition. Therefore, current will flow proportionately through the two transistors as they simultaneously approach and recede from near saturation.

The carrier input at the terminal 36 drives the direct coupled transistors 10 and 40 which, because of their biasing, develops a comparatively fixed square wave output level regardless of the input amplitude. Thus, the pulse transformer 56 is driven with a constant amplitude pulse which in turn drives the base-emitter junctions of transistors 60 and 70 with a square wave pulse having a relatively constant width and amplitude. The resistor 78 constitutes an adjusting and stabilizing resistance in the emitter circuit of transistors 60 and 70 and is made approximately the sum of dynamic impedances of both transistors. The variable tap 78 on the resistor 77 offers means for compensation of the base-emitter characteristic variations in the transistors. Balance adjustments at the tap 78 must be made in the dynamic state, that is, when the transistors are in essentially full conduction. With perfectly balanced transistors, the tap 78 may be centered and fixed.

As noted, the transformer 56 is provided with a Faraday shield between the windings. This shield helps to improve system balance by reducing transform interwinding capacitance. In addition, the driving of the modulator with a square wave also reduces the tendency towards unbalance and corresponding distortion in the modulator during the cut-on and cut-off phases of the cycle.

It will be recognized by those skilled in the art that the invention is not limited to the introducion of a single modulation signal but that several signals may be introduced onto the carrier or chopper frequency by the addition of transistors in the modulator loop, either paralleled with the base-emitter junction of transistor 60 or in extension of the series mode. Some designs might use series parallel combinations to advantage. Thus, while simple circuitry has been shown to explain the principles of the present invention, it is also adaptable to systems in which plural signals are introduced. Moreover, while a saturable amplifier has been illustrated in which the positive and negative peaks of the carrier frequency are clipped in the second stage, the same result might also be accomplished by clipping one of the peaks in the first stage and the other peak in the second stage. In addition, it is possible to substitute a Schmitt trigger operated at the carrier frequency for developing a square wave for driving he modulator.

In order to better enable persons skilled in the art to reproduce this invention, the circuit parameters used in a system actually reduced to practice are listed below.

| | | |
|---|---|---|
| Transistors **10**, **40**, **60**, and **70** | | Type 2N2651 |
| Capacitors: | | |
| **32** | μf | .1 |
| **34** | μf | .1 |
| **38** | μf | .1 |
| **52** | μf | .1 |
| **86** | pf | 47 |
| Resistors: | | |
| **22** | ohms | 1K |
| **26** | do | 2.7K |
| **28** | do | 27K |
| **30** | do | 27K |
| **48** | do | 3.9K |
| **50** | do | 2.75K |
| **76** | do | 50 |
| **82** | do | 1.5K |
| **83** | do | 1K |
| **84** | do | 560 |
| **90** | do | 330 |
| Choke **24** | μh | 1000 |
| Inductor **20** | mh | 10 |

The carrier was at the system intermediate frequency of 700 kc., and the modulation signal was in the audio range of 30 to 7500 cycles per second.

It should be understood that the foregoing parameters are illustrative and are in no way limiting of the scope of this invention which is defined by the annexed claims.

What is claimed is:

1. A suppressed carrier signal translator comprising:
a balanced modulator comprising first and second transistors, each having a base, an emitter, and a collector, said emitters being interconnected;
a load resistor connected to the collector of said second transistor;
a source of modulation signals connected in a series loop with the collector and emitter of said first transistor, the emitter and collector of said second transistor, and said load;
a source of carrier frequency signals, said carrier frequency signals being essentially a square wave having essentially constant amplitude and width, said source of carrier frequency signals being coupled in the same phase across the base-emitter junction of each of said transistors;
whereby an amplitude modulated output signal is derived from across said load resistor, said carrier frequency signal being suppressed.

2. The invention as defined in claim 1 wherein said emitters of said modulator are interconnected through a resistor, and wherein said source of carrier frequency signals is coupled in the same phase across the base-emitter junction of each of said transistors through a tap on said resistor.

3. The invention as defined in claim 2 wherein said tap is movable.

4. The invention as defined in claim 3 wherein said source of carrier frequency signals is coupled in the same phase across the base-emitter junctions of each of said transistors by means of a shielded transformer.

5. A suppressed carrier signal translator comprising:
a source of carrier frequency signals having a sine wave form;
means for amplifying said carrier frequency signals, said means including a transistor prebiased to saturate when the applied carrier frequency signals exceed a predetermined positive and negative level, whereby the positive and negative peaks of said sine wave are clipped to produce an essentially square wave form;
a balanced modulator;

a shielded transformer for coupling said square wave form to said balanced modulator, said balanced modulator comprising first and second transistors, each having a base, an emitter, and a collector, said emitters being interconnected through a resistor, said resistor having a movable tap;

a load resistor connected to the collector of said second transistor;

a source of modulation signals connected in a series loop with the collector and emitter of said first transistor, said resistor, the emitter and collector of said second transistor, and said load, in the order named, said shielded transformer being connected in the same phase between the base of each of said transistors and said movable tap, whereby an amplitude modulated output signal is derived from across said load resistor, said carrier frequency signal being suppressed.

6. The invention as defined in claim 5 wherein the impedance of said resistor is approximately the sum of the dynamic impedances of the collector-emitter junctions of both transistors.

7. A suppressed carrier signal translator comprising:

a balanced modulator comprising first and second transistors, each having a base, an emitter, and a collector, said emitters being interconnected;

a load resistor connected to the collector of said second transistor;

a source of modulation signals connected in a series loop with the collector and emitter of said first transistor, the emitter and collector of said second transistor, and said load;

a source of carrier frequency signals having essentially constant amplitude, said source of carrier frequency signals being coupled in the same phase across the base-emitter junction of each of said transistors, whereby an amplitude modulated output signal is derived from across said load resistor, said carrier frequency signal being suppressed.

References Cited

UNITED STATES PATENTS

| | | | |
|---|---|---|---|
| 2,864,961 | 12/1958 | Lohman et al. | 307—885 |
| 3,027,522 | 3/1962 | Boxall et al. | 332—44 |
| 3,072,854 | 1/1963 | Case | 332—9 X |
| 3,096,492 | 7/1963 | Vogt | 332—44 X |
| 3,229,230 | 1/1966 | Feldman | 322—44 |
| 3,239,780 | 3/1966 | Echarti | 332—43 |

ALFRED L. BRODY, *Primary Examiner.*